(12) United States Patent
Kim et al.

(10) Patent No.: US 10,134,652 B2
(45) Date of Patent: Nov. 20, 2018

(54) SUBSTRATE FOR INTEGRATED CIRCUIT PACKAGE

(71) Applicant: Corning Precision Materials Co., Ltd., Chungcheongnam-do (KR)

(72) Inventors: Joon Soo Kim, Chungcheongnam-do (KR); Hyung Soo Moon, Chungcheongnam-do (KR); Jae Young Choi, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/514,753

(22) PCT Filed: Sep. 18, 2015

(86) PCT No.: PCT/KR2015/009800
§ 371 (c)(1),
(2) Date: Mar. 27, 2017

(87) PCT Pub. No.: WO2016/047969
PCT Pub. Date: Mar. 31, 2016

(65) Prior Publication Data
US 2017/0243799 A1    Aug. 24, 2017

(30) Foreign Application Priority Data
Sep. 25, 2014   (KR) .................. 10-2014-0128196

(51) Int. Cl.
*H01L 23/15*        (2006.01)
*H01L 23/00*        (2006.01)
*H01L 23/373*       (2006.01)

(52) U.S. Cl.
CPC .......... *H01L 23/15* (2013.01); *H01L 23/3735* (2013.01); *H01L 23/562* (2013.01);
(Continued)

(58) Field of Classification Search
CPC ............ H01L 23/15; H01L 2924/3511; H05K 1/0306
See application file for complete search history.

(56) References Cited

U.S. PATENT DOCUMENTS

| | | | |
|---|---|---|---|
| 8,525,341 B2* | 9/2013 | Kim ..................... | H05K 3/4602 174/250 |
| 2005/0121768 A1* | 6/2005 | Edelstein .............. | H01L 21/486 257/698 |

(Continued)

FOREIGN PATENT DOCUMENTS

| | | |
|---|---|---|
| KR | 648968 B1 | 11/2006 |
| KR | 20120077510 A | 7/2012 |

(Continued)

OTHER PUBLICATIONS

International Search Report for Application No. PCT/KR2015/009800 dated Jan. 26, 2016.

*Primary Examiner* — David A Zarneke
(74) *Attorney, Agent, or Firm* — Lerner, David, Littenberg, Krumholz & Mentlik, LLP

(57) ABSTRACT

The present invention relates to a substrate for an integrated circuit package and, more specifically, to a substrate for an integrated circuit package, which reduces mismatch of coefficients of thermal expansion with a semiconductor chip, thereby preventing or minimizing warpage during a reflow process. To this end, the present invention provides a substrate for an integrated circuit package which is interposed between a semiconductor chip and a printed circuit board to electrically connect the semiconductor chip to the printed circuit board, the substrate comprising: an ultra-thin glass; a first CTE control layer which is formed on the upper surface of the ultra-thin glass and formed of a material having a coefficient of thermal expansion different from the coefficients of thermal expansion of the semiconductor chip and (Continued)

the ultra-thin glass; a first metal thin plate which is formed on the upper surface of the first CTE control layer and connected to the semiconductor chip; and a second metal thin plate which is formed on the lower surface of the ultra-thin glass and connected to the printed circuit board.

5 Claims, 2 Drawing Sheets

(52) U.S. Cl.
CPC .............. *H01L 2924/0002* (2013.01); *H01L 2924/3511* (2013.01)

(56) References Cited

U.S. PATENT DOCUMENTS

| | | | | |
|---|---|---|---|---|
| 2008/0251932 A1* | 10/2008 | Arana | ............... | H01L 21/76898 257/774 |
| 2010/0232127 A1* | 9/2010 | Mori | ................. | H01L 23/49822 361/783 |
| 2012/0168951 A1 | 7/2012 | Kim et al. | | |
| 2013/0063918 A1 | 3/2013 | Haba et al. | | |
| 2013/0119555 A1* | 5/2013 | Sundaram | ............. | H01L 21/486 257/774 |
| 2013/0170760 A1* | 7/2013 | Wang | ................. | G06K 9/00771 382/224 |
| 2013/0175558 A1 | 7/2013 | Orsley et al. | | |
| 2013/0180760 A1 | 7/2013 | Aoshima et al. | | |
| 2013/0242520 A1 | 9/2013 | Onozuka | | |
| 2014/0240821 A1* | 8/2014 | Ballou | ................. | G02B 5/0858 359/360 |
| 2016/0150642 A1* | 5/2016 | Kajita | .................... | H05K 1/115 361/783 |
| 2017/0019996 A1* | 1/2017 | Watanabe | ............. | H05K 1/112 |
| 2018/0082959 A1* | 3/2018 | Gelorme | ............. | H01L 23/562 |

FOREIGN PATENT DOCUMENTS

| | | |
|---|---|---|
| KR | 20130133199 A | 12/2013 |
| KR | 20140009987 A | 1/2014 |
| KR | 20140063710 A | 5/2014 |
| KR | 20140081819 A | 7/2014 |

* cited by examiner

SUBSTRATE FOR INTEGRATED CIRCUIT PACKAGE

CROSS-REFERENCE TO RELATED APPLICATION

This application is a national phase entry under 35 U.S.C. § 371 of International Application No. PCT/KR2015/009800, filed Sep. 18, 2015, published in Korean, which claims priority to Korean Patent Application No. 10-2014-0128196, filed on Sep. 25, 2014, the disclosures of which are incorporated herein by reference.

TECHNICAL FIELD

The present invention relates to a substrate for an integrated circuit (IC) package, and more particularly, to an IC package substrate having a reduced mismatch of coefficients of thermal expansion (CTEs) with a semiconductor chip, thereby preventing or minimizing warping in a reflow process.

BACKGROUND ART

A substrate for an integrated circuit (IC) package or an IC package substrate is an intermediate substrate electrically connecting a semiconductor chip to a printed circuit board (PCB), acting as an interface to transfer electrical signals between semiconductor chips and the PCB. At this time, solder bumps are generally used to electrically connect the semiconductor chip to the IC package substrate. Such a connection process is referred to as a reflow process. The reflow process is undertaken at about 260° C. for about 20 seconds, followed by a process of cooling to room temperature. However, when cooled to room temperature, the IC package substrate may have a warping defect, due to a difference in coefficients of thermal expansion (CTEs) between the upper semiconductor chip and the lower IC package substrate. That is, the CTE of Si, mainly used as a semiconductor chip material, is about 2.6 ppm/° C., while the CTE of a copper clad laminate (CCL), conventionally used as an IC package substrate, is about 15 ppm/° C. Such a significant CTE mismatch between the upper semiconductor chip and the lower CCL causes non-coincidental thermal expansion between the two layers in a high temperature reflow process performed at 260° C. Thus, during the cooling process, the two layers may have a warping defect instead of maintaining the original shapes thereof being maintained. In addition, when a warping defect occurs, the solder bumps electrically connecting the two layers may be broken, thereby causing electrical disconnection, i.e. a failure in the transmission of an electrical signal. Here, in the case of a substrate having a certain thickness, a significant defect is not caused by the CTE difference. However, since the thickness of the substrate may be reduced in accordance with the current trend within the semiconductor industry for lighter, thinner, and smaller designs, a CTE difference is more likely to cause a warping defect and a variety of resultant defects, with decreases in the thickness of the substrate. In addition, in accordance with the trend within the semiconductor industry for lighter, thinner, and smaller designs, the thickness of the semiconductor chip is being further reduced along with a smaller pitch size. As described above, the size of micro solder bumps also decreases with decreases in the pitch size. In this case, the micro solder bumps may be more vulnerable to a warping defect, i.e. may be broken even by a small warping defect.

[Related Art Document]
Patent Document 1: Korean Patent No. 10-0648968 (Nov. 16, 2006)

DISCLOSURE

Technical Problem

Accordingly, the present disclosure has been made in consideration of the above problems occurring in the related art, and the present disclosure proposes an integrated circuit (IC) package substrate having a reduced mismatch of thermal expansion coefficients (CTEs) with a semiconductor chip, thereby preventing or minimizing warping in a reflow process.

Technical Solution

According to an aspect of the present disclosure, provided is an IC package substrate sandwiched between a semiconductor chip and a printed circuit board to electrically connect the semiconductor chip and the printed circuit board. The IC package substrate may include: an ultra-thin glass sheet; a first thermal expansion coefficient control layer provided on a top surface of the ultra-thin glass sheet; a first thin metal film provided on a top surface of the first thermal expansion coefficient control layer to be connected to a semiconductor chip; and a second thin metal film provided on a bottom surface of the ultra-thin glass sheet to be connected to a printed circuit board, wherein the first thermal expansion coefficient control layer is formed from a material having a different CTE from the semiconductor chip and the ultra-thin glass sheet.

The semiconductor chip, the first thin metal film, and the first thermal expansion coefficient control layer may constitute a first composite. The first thermal expansion coefficient control layer, the ultra-thin glass sheet, and the second thin metal film may constitute a second composite. A CTE of the first composite is the same as a CTE of the second composite.

A thickness of the first thermal expansion coefficient control layer may depend on a thickness of the semiconductor chip and a thickness of the ultra-thin glass sheet.

A thickness of the ultra-thin glass sheet may depend on a thickness of the semiconductor chip and a thickness of the first thermal expansion coefficient control layer.

The IC package substrate may further include a second thermal expansion coefficient control layer disposed between the ultra-thin glass sheet and the second thin metal film.

The semiconductor chip, the first thin metal film, and the first thermal expansion coefficient control layer may constitute a third composite. The first thermal expansion coefficient control layer, the ultra-thin glass sheet, the second thermal expansion coefficient control layer, and the second thin metal film may constitute a fourth composite. A CTE of the third composite is the same as a CTE of the fourth composite.

Advantageous Effects

According to the present disclosure, an ultra-thin glass and a CTE control layer deposited on the top surface or both the top and bottom surfaces of the ultra-thin glass can prevent or minimize the warping of either a semiconductor chip or an IC package substrate occurring due to the CTE mismatch between the semiconductor chip and the IC package substrate during a reflow process.

In addition, according to the present disclosure, the CTE control layer serving as a reinforcing layer for the ultra-thin glass can facilitate a subsequent machining operation, such as hole-drilling or cutting, thereby improving machinability of the IC package substrate.

MODE FOR INVENTION

Hereinafter, a substrate for an integrated circuit (IC) package according to embodiments of the present disclosure will be described in detail with reference to the accompanying drawings.

In the following description, detailed descriptions of known functions and components incorporated herein will be omitted in the case that the subject matter of the present disclosure is rendered unclear by the inclusion thereof.

Figure 1:
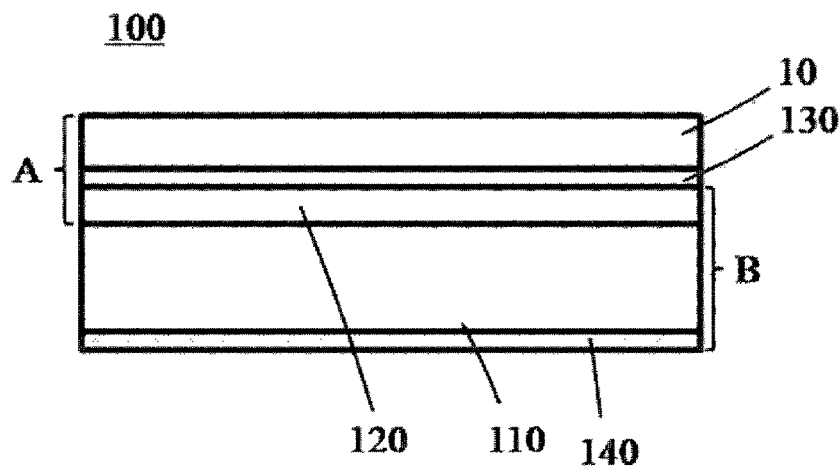
FIG. 1 is a schematic cross-sectional view illustrating an IC package substrate with a semiconductor chip mounted thereon according to an embodiment of the present disclosure.

As illustrated in FIG. 1, an IC package substrate 100 according to an embodiment of the present disclosure is an intermediate media or an intermediate substrate sandwiched between a semiconductor chip 10 and a printed circuit board (PCB) to electrically connect the semiconductor chip 10 and the PCB. The IC package substrate 100 includes an ultra-thin glass sheet 110, a first CTE (coefficient of thermal expansion) control layer 120, a first thin metal film 130, and a second thin metal film 140.

Figure 2:
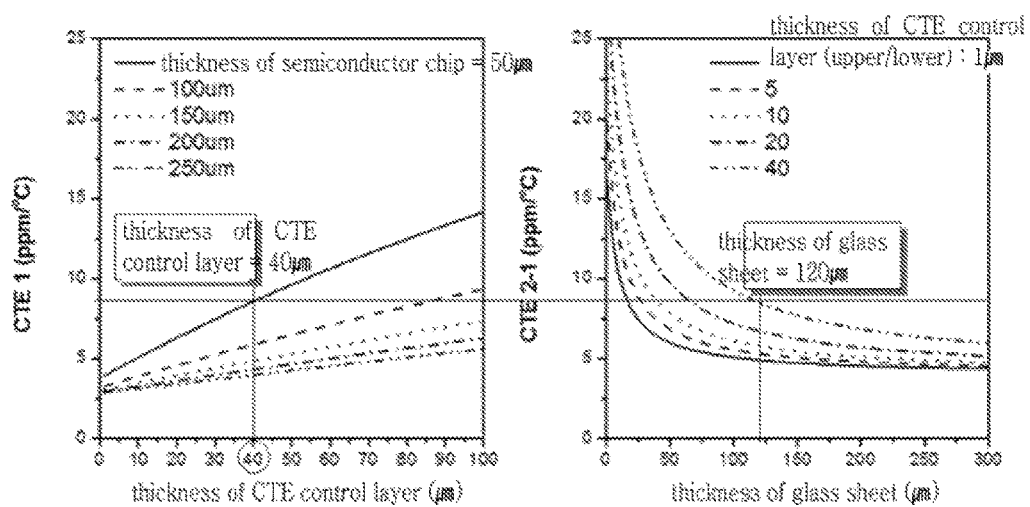
FIG. 2 illustrates changes in coefficients of thermal expansion (CTEs) in the IC package substrate according to the embodiment of the present invention, wherein changes in CTE 1 depending on the thickness of a CTE control layer are represented in a graph to the left, while changes in CTE 2 depending on the thickness of an ultra-thin glass sheet are represented in a graph to the right.

The ultra-thin glass sheet 110 may have a thickness of 120 µm when the overall thickness of the IC package substrate 100 according to the embodiment of the present disclosure is 216 µm. The thickness of the ultra-thin glass sheet 110 is determined by the thickness of the semiconductor chip 10 and the thickness of the first CTE control layer 120. Specifically, as illustrated in FIG. 2, when the thickness of the semiconductor chip 10 is 50 µm and the thickness of the first CTE control layer 120 is 40 µm, the thickness of the ultra-thin glass sheet 110 may be determined to be 120 µm. As also illustrated in FIG. 2, the thickness of the ultra-thin glass sheet 110 may be changed depending on the thickness of the semiconductor chip 10 and the thickness of the first CTE control layer 120. This will be described in detail later.

The ultra-thin glass sheet 110 used in the embodiment of the present invention may have a Poisson's ratio of 0.2 to 2.5, a thermal expansion coefficient of 3 ppm/K to 5 ppm/K, a Young's modulus of 70 GPa to 75 GPa, a density of 2.3 $g/cm^3$ to 2.5 $g/cm^3$, and a bulk modulus of 47.2 Gpa.

The first CTE control layer 120 is provided on the top surface of the ultra-thin glass sheet 110. The first CTE control layer 120 is formed from a material having a different coefficient of thermal expansion (CTE) from either the semiconductor chip 10 or the ultra-thin glass sheet 110. The thickness of the first CTE control layer 120 is determined by the thickness of the semiconductor chip 10 and the thickness of the ultra-thin glass sheet 110. Since the semiconductor chip 10 having a thickness of 50 µm and the ultra-thin glass sheet 110 having a thickness of 120 µm may be used according to the embodiment of the present disclosure, the thickness of the first CTE control layer 120 may be determined to be 40 µm. The thickness of the first CTE control layer 120 may be determined in the process of matching the CTEs of a first composite A and a second composite B, wherein the first composite A is defined by or includes the semiconductor chip 10, the first thin metal film 130, and the first CTE control layer 120, while the second composite B is defined by or includes the first CTE control layer 120, the ultra-thin glass sheet 110, and the second thin metal film 140. This will be described in detail later.

The first CTE control layer 120 is shared by the first composite A and the second composite B to serve as a layer controlling the CTEs of the first and second composites A and B, and as a layer reinforcing the ultra-thin glass sheet 110. Specifically, the first CTE control layer provided on the ultra-thin glass sheet 110 can facilitate a subsequent machining operation, such as hole-drilling or cutting, thereby improving machinability of the IC package substrate 100.

In addition, according to an embodiment of the present disclosure, the first CTE control layer 120 may have a Poisson's ratio of 0.35, a CTE of 50 ppm/° C., a Young's modulus of 1 GPa to 100 GPa, preferably, 11.3 GPa, a density of 1.75 $g/cm^3$ to 1.77 $g/cm^3$, and a bulk modulus of 12.5 Gpa. In addition to these physical properties, the first CTE control layer 120 can maintain thermal stability at 260 to 280° C. or more, must have an adhesion strength of 4 $N/mm^2$ to 5 $N/mm^2$ with the ultra-thin glass sheet 110, and superior processability with respect to spin coating, dip coating, bar coating, or the like to coat the ultra-thin glass sheet 110 with a thin-film.

The first thin metal film 130 is a thin copper (Cu) film formed on the top surface of the first CTE control layer 120, while the second thin metal film 140 is the same thin Cu film as the first thin metal film 130 and is formed on the bottom surface of the ultra-thin glass sheet 110. The first thin metal film 130 is connected to the semiconductor chip 10 disposed thereon, and the second thin metal film 140 is connected to a PCB (not shown) disposed therebelow.

According to an embodiment of the present disclosure, the first thin metal film 130 and the second thin metal film 140 have respective thicknesses of 3 µm. In addition, the first thin metal film 130 and the second thin metal film 140 respectively have a Poisson's ratio of 0.34, a CTE of 16.5 ppm/K, a Young's modulus of 110 Gpa to 128 Gpa, a density of 8.96 $g/cm^3$, and a bulk modulus of 128.6 Gpa.

In addition, according to an embodiment of the present disclosure, the semiconductor chip 10 has a Poisson's ratio of 0.064 to 0.28, a CTE of 2.6 ppm/K, a Young's modulus of 130 GPa to 188 GPa, a density of 2.329 $g/cm^3$, and a bulk modulus of 119.2 Gpa.

According to an embodiment, the CTE of the first composite A comprised of the semiconductor chip 10, the first thin metal film 130, and the first CTE control layer 120 is the same as the CTE of the second composite B comprised of the first CTE control layer 120, the ultra-thin glass sheet 110, and the second thin metal film 140. This can consequently prevent or minimize the warping of either the semiconductor chip or a copper clad laminate (CCL) layer conventionally occurring due to the CTE mismatch between the semiconductor chip and the CCL layer.

Here, the CTE of the first composite A and the CTE of the second composite B can be set to be the same as each other by controlling the characteristics of the first CTE control layer included in both the composites A and B.

First, the CTE of each of the first composite A and the second composite B can be simulated by applying the following Turner's model for calculating the CTE of a composite:

$$\alpha = \frac{\alpha_c \Phi_c K_c + \alpha_w \Phi_w K_w + \alpha_p \Phi_p K_p}{\Phi_c K_c + \Phi_w K_w + \Phi_p K_p},$$

where $\alpha$ is a CTE, $\Phi$ is a volume fraction of a thin metal film c, an ultra-thin glass sheet w, and a first CTE control layer p in a composite, and K is the bulk modulus. K is defined as follows:

$$K = \frac{E}{3(1-2v)},$$

where E is a Young's modulus, and v is a Poisson's ratio.

FIG. 2 illustrates changes in the CTEs of the first second composites A and B calculated by entering values indicative of the physical properties of the ultra-thin glass sheet, the first CTE control layer, and the first and second thin metal films in the former equations, wherein one graph (left) represents changes in the CTE of the first composite A depending on changes in the thickness of the semiconductor chip and the first CTE control layer, while the other graph (right) represents changes in the CTE of the second composite B depending on changes in the thickness of the first CTE control layer and the ultra-thin glass sheet.

According to an embodiment of the present disclosure, a thickness of the first CTE control layer 120 or the ultra-thin glass sheet 110 to allow the CTE of the first composite A and the CTE of the second composite B to be the same as each other, can be determined based on the graphs in FIG. 2. For example, when the thickness of the semiconductor chip 10 is 50 µm and the thickness of the first CTE control layer 120 is set to be 40 µm, the CTE of the first composite A is about 8 ppm/° C. Thus, the CTE of the second composite B is 8 ppm/° C. when the thickness of the ultra-thin glass sheet 110 is determined to be 120 µm. In contrast, when the CTE of the second composite B is determined by selection of thicknesses of the semiconductor chip 10 and the ultra-thin glass sheet 110, the thickness of the first CTE control layer 120 allowing the first composite A to have the same CTE as the second composite B is determined.

As described above, in the IC package substrate 100 according to the embodiment, the CTE of the first composite A comprised of the semiconductor chip 10, the first thin metal film 130, and the first CTE control layer 120 is set to be the same as the CTE of the second composite B comprised of the first CTE control layer 120, the ultra-thin glass sheet 110, and the second thin metal film 140. This configuration can consequently prevent or minimize the warping of either the semiconductor chip or the IC package substrate 100 occurring due to a CTE mismatch therebetween during a reflow process, thereby improving the quality of an electrical connection between the semiconductor chip and a PCB (not shown).

In addition, in the IC package substrate 100 according to an embodiment of the present disclosure, the first CTE control layer 120 serving as a reinforcing layer for the ultra-thin glass sheet 110 can improve processability with respect to operations, such as hole-drilling and cutting.

Hereinafter, an IC package substrate according to another embodiment of the present disclosure will be described with reference to FIGS. 3 and 4.

Figure 3:
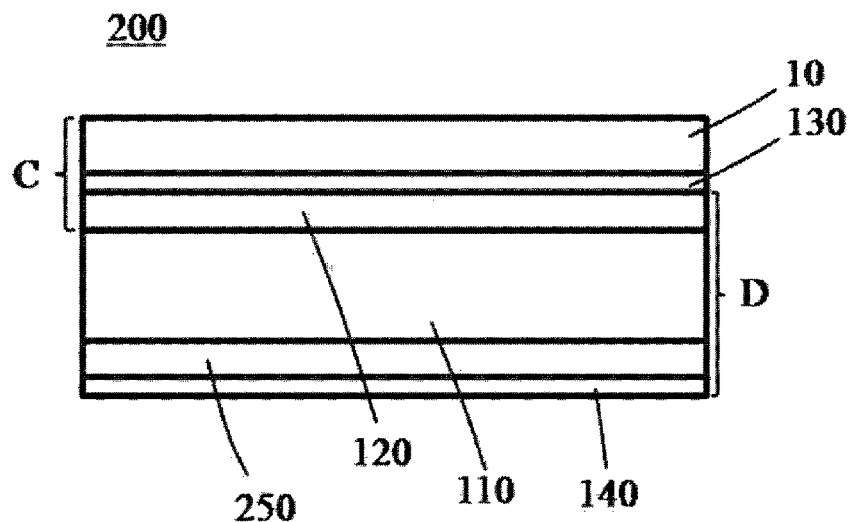
FIG. 3 is a schematic cross-sectional view illustrating an IC package substrate with a semiconductor chip mounted thereon according to another embodiment of the present disclosure; and mom
Figure 4:
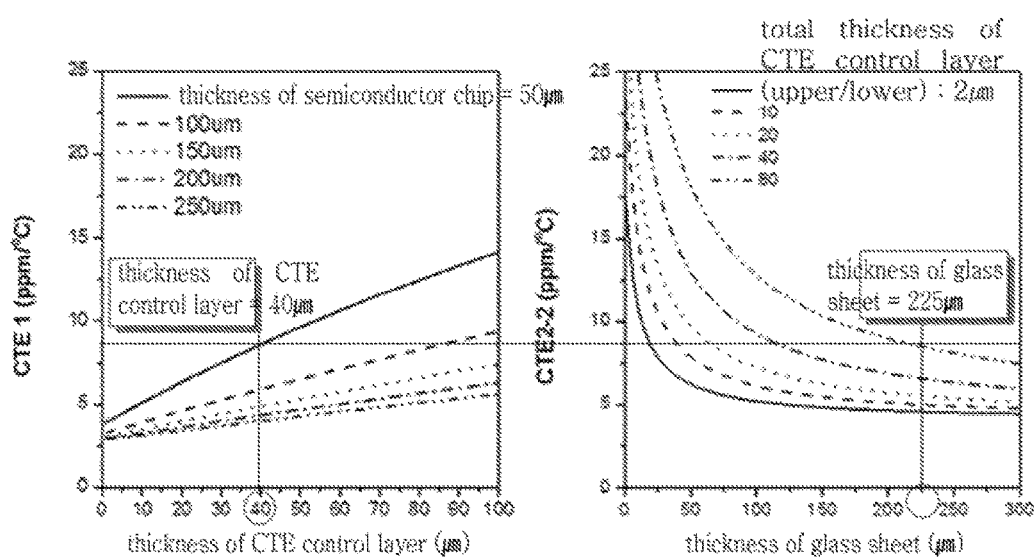
FIG. 4 illustrates changes in CTEs in the IC package substrate according to the another embodiment of the present invention, wherein changes in CTE 1 depending on the thickness of a CTE control layer are represented in a graph to the left, while changes in CTE 2 depending on the thickness of an ultra-thin glass sheet are represented in a graph to the right.

FIG. 3 is a schematic cross-sectional view illustrating an IC package substrate with a semiconductor chip mounted thereon according to the another embodiment of the present disclosure, and FIG. 4 illustrates changes in CTEs in the IC package substrate according to the another embodiment of the present invention, wherein changes in CTE 1 depending on the thickness of a CTE control layer are represented in a graph (left), while changes in CTE 2 depending on the thickness of an ultra-thin glass sheet are represented in a graph (right).

As illustrated in FIG. 3, the IC package substrate 200 according to the another embodiment of the present disclosure includes an ultra-thin glass sheet 110, a first CTE control layer 120, a first thin metal film 130, a second thin metal film 140, and a second CTE control layer 250.

The present embodiment is the same as the former embodiment except that the second CTE control layer is added. Thus, the same reference numerals are used to designate the same components, and detailed descriptions of previous disclosures will be omitted.

The second CTE control layer 250 according to the another embodiment of the present invention is provided between the ultra-thin glass sheet 110 and the second thin metal film 140. Here, the second CTE control layer 250 has the same thickness and physical properties as the first CTE control layer 120.

According to the another embodiment of the present disclosure, a third composite C is comprised of the semiconductor chip 10, the first thin metal film 130, and the first CTE control layer 120, while a fourth composite D is comprised of the first CTE control layer 120, the ultra-thin glass sheet 110, the second CTE control layer 250, and the second thin metal film 140. The CTE of the third composite C and the CTE of the fourth composite D are the same as each other, so that the warping of either the semiconductor chip 10 or the IC package substrate 100 is prevented or minimized.

As in the former embodiment, according to the another embodiment of the present disclosure, thicknesses of the first and second CTE control layers 120 and 250 or a thickness of the ultra-thin glass sheet 110 to allow the CTEs of the third composite C and the fourth composite D to be the same as each other, can be determined based on the graphs in FIG. 4. For example, when the thickness of the semiconductor chip 10 is 50 µm and the thicknesses of the first and second CTE control layers 120 and 250 are respectively set to be 40 µm, the CTE of the third composite A is 8 ppm/° C. Thus, the CTE of the fourth composite D is 8 ppm/° C. when the thickness of the ultra-thin glass sheet 110 is determined to be 225 µm. In contrast, when the CTE of the fourth composite D is determined by selection of thicknesses of the semiconductor chip 10 and the ultra-thin glass sheet 110, the thicknesses of the first and second CTE control layers 120 and 250 allowing the third composite C to have the same CTE as the fourth composite D are determined.

In the IC package substrate 200 according to the another embodiment of the present disclosure, the ultra-thin glass sheet 110 is required to be thicker than the substrate 100 by 105 µm, so that the third and fourth composites C and D can have the same CTEs, and the second CTE control layer 250 having a thickness of 40 µm is further provided. Thus, the overall thickness of the substrate according to the another embodiment is greater than the thickness of the substrate 100 by 145 µm.

Since the substrate 200 according to the another embodiment of the present disclosure includes the first and second CTE control layers 120 and 250 serving as reinforcing layers for the ultra-thin glass sheet 110, the substrate 200 can have a higher level of mechanical stability than the substrate 100 according to the former embodiment, thereby enabling a more reliable machining operation. On the other hand, the former embodiment may be more compliant with trends for lighter, thinner, and smaller semiconductor designs, because the same improvements in warping-involved characteristics can be achieved with a smaller thickness than the another embodiment.

That is, the IC package substrate 100 according to the former embodiment and the IC package substrate 200 according to the another embodiment can be selectively used depending on the process and the model as required.

The foregoing descriptions of specific exemplary embodiments of the present disclosure have been presented with respect to the drawings. They are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. An integrated circuit package substrate sandwiched between a semiconductor chip and a printed circuit board to electrically connect the semiconductor chip and the printed circuit board, the integrated circuit package substrate comprising:
   an ultra-thin glass sheet;
   a first thermal expansion coefficient control layer provided on a top surface of the ultra-thin glass sheet;
   a first thin metal film provided on a top surface of the first thermal expansion coefficient control layer to be connected to a semiconductor chip; and
   a second thin metal film provided on a bottom surface of the ultra-thin glass sheet to be connected to a printed circuit board,
   wherein the first thermal expansion coefficient control layer is formed from a material having a different coefficient of thermal expansion from the semiconductor chip and the ultra-thin glass sheet, and
   wherein a thickness of the ultra-thin glass sheet depends on a thickness of the semiconductor chip and a thickness of the first thermal expansion coefficient control layer.

2. The integrated circuit package substrate of claim 1, wherein the semiconductor chip, the first thin metal film, and the first thermal expansion coefficient control layer constitute a first composite, and the first thermal expansion coefficient control layer, the ultra-thin glass sheet, and the second thin metal film constitute a second composite, wherein a coefficient of thermal expansion of the first composite is the same as a coefficient of thermal expansion of the second composite.

3. The integrated circuit package substrate of claim 1, wherein a thickness of the first thermal expansion coefficient control layer depends on a thickness of the semiconductor chip and a thickness of the ultra-thin glass sheet.

4. The integrated circuit package substrate of claim 1, further comprising a second thermal expansion coefficient control layer disposed between the ultra-thin glass sheet and the second thin metal film.

5. The integrated circuit package substrate of claim 4, wherein the semiconductor chip, the first thin metal film, and the first thermal expansion coefficient control layer constitute a third composite, and the first thermal expansion coefficient control layer, the ultra-thin glass sheet, the second thermal expansion coefficient control layer, and the second thin metal film constitute a fourth composite, wherein a coefficient of thermal expansion of the third composite is the same as a coefficient of thermal expansion of the fourth composite.

* * * * *